United States Patent
Blanchet et al.

(10) Patent No.: US 10,115,988 B2
(45) Date of Patent: Oct. 30, 2018

(54) HEALTH MONITORING OF AN ELECTROCHEMICAL CELL STACK

(71) Applicant: NUVERA FUEL CELLS, INC., Billerica, MA (US)

(72) Inventors: Scott Blanchet, Chelmsford, MA (US); Ed Domit, Westford, MA (US)

(73) Assignee: Nuvera Fuel Cells, LLC, Billerica, MA (US)

(*) Notice: Subject to any disclaimer, the term of this patent is extended or adjusted under 35 U.S.C. 154(b) by 637 days.

(21) Appl. No.: 14/296,974

(22) Filed: Jun. 5, 2014

(65) Prior Publication Data

US 2014/0363751 A1 Dec. 11, 2014

Related U.S. Application Data

(60) Provisional application No. 61/832,378, filed on Jun. 7, 2013.

(51) Int. Cl.
*H01M 8/04* (2016.01)
*C25B 15/02* (2006.01)
(Continued)

(52) U.S. Cl.
CPC ........... *H01M 8/04544* (2013.01); *C25B 1/12* (2013.01); *C25B 9/00* (2013.01); *C25B 15/02* (2013.01);
(Continued)

(58) Field of Classification Search
CPC ........... H01M 8/0438; H01M 8/04544; H01M 8/04559; H01M 8/04649; H01M 8/04679;
(Continued)

(56) References Cited

U.S. PATENT DOCUMENTS

2002/0114986 A1* 8/2002 Aoyagi ............... B60L 11/1887
429/431
2002/0146602 A1* 10/2002 Abe .................. H01M 8/04014
429/429
(Continued)

FOREIGN PATENT DOCUMENTS

JP 2006-085959 A 3/2006
JP 2007-080708 A 3/2007
JP 2009-087741 A 4/2009

OTHER PUBLICATIONS

PCT Notification of Transmittal of The International Search Report and The Written Opinion of the International Searching Authority, or the Declaration issued in International Application No. PCT/US2014/041091, dated Aug. 7, 2014, 11 pages.
(Continued)

*Primary Examiner* — Barbara L Gilliam
*Assistant Examiner* — Adam A Arciero
(74) *Attorney, Agent, or Firm* — Finnegan, Henderson, Farabow, Garrett & Dunner LLP.

(57) ABSTRACT

The present disclosure is directed towards a method and a system for monitoring the performance of an electrochemical cell stack. Monitoring can be performed remotely by measuring the voltage across the stack, and comparing the measured values to predetermined reference values to determine the condition of the stack. Monitoring of the stack voltage enables detection of performance decay, which in turn enables preemptive repair of the stack prior to catastrophic failure.

7 Claims, 2 Drawing Sheets

(51) Int. Cl.
  *G01R 31/36* (2006.01)
  *C25B 9/00* (2006.01)
  *H01M 8/04537* (2016.01)
  *C25B 1/12* (2006.01)
  *H01M 8/04858* (2016.01)
  *H01M 8/04664* (2016.01)
  *H01M 8/0438* (2016.01)

(52) U.S. Cl.
  CPC ...... *G01R 31/3624* (2013.01); *H01M 8/0491* (2013.01); *H01M 8/04559* (2013.01); *H01M 8/04649* (2013.01); *H01M 8/04679* (2013.01); *H01M 8/0438* (2013.01); *Y02E 60/366* (2013.01)

(58) Field of Classification Search
  CPC ........ H01M 8/0491; C25B 15/02; C25B 1/12; C25B 9/00; G01R 31/3624
  See application file for complete search history.

(56) References Cited

U.S. PATENT DOCUMENTS

| | | |
|---|---|---|
| 2006/0051628 A1 | 3/2006 | Lim et al. |
| 2006/0289312 A1 | 12/2006 | Tremblay et al. |
| 2010/0173212 A1 | 7/2010 | Senoue et al. |
| 2012/0058404 A1 | 3/2012 | Ishikawa et al. |

OTHER PUBLICATIONS

Australian Patent Application No. 2014274877: Examination Report No. 1, dated Oct. 18, 2017 (4 pages).
Communication Pursuant to Article 94(3) EPC issued in European Patent Application No. 14 733 484.1 dated Dec. 18, 2017 (5 pages).
Notice of Reasons for Rejection issued in Japanese Patent Application No. 2016-517995 dated Feb. 7, 2018 (5 pages).

\* cited by examiner

HEALTH MONITORING OF AN ELECTROCHEMICAL CELL STACK

This application claims the benefit of U.S. Provisional Application No. 61/832,378, filed Jun. 7, 2013, which is incorporated herein by reference.

The present disclosure is directed towards electrochemical cells, and more specifically, a method and a system for monitoring an electrochemical cell or a stack of cells.

Electrochemical cells, usually classified as fuel cells or electrolysis cells, are devices used for generating current from chemical reactions, or inducing a chemical reaction using a flow of current. A fuel cell converts the chemical energy of a fuel (e.g., hydrogen, natural gas, methanol, gasoline, etc.) and an oxidant (air or oxygen) into electricity and waste products of heat and water. A basic fuel cell comprises a negatively charged anode, a positively charged cathode, and an ion-conducting material called an electrolyte.

Different fuel cell technologies utilize different electrolyte materials. A Proton Exchange Membrane (PEM) fuel cell, for example, utilizes a polymeric ion-conducting membrane as the electrolyte. In a hydrogen PEM fuel cell, hydrogen atoms are electrochemically split into electrons and protons (hydrogen ions) at the anode. The electrons flow through the circuit to the cathode and generate electricity, while the protons diffuse through the electrolyte membrane to the cathode. At the cathode, hydrogen protons combine with electrons and oxygen (supplied to the cathode) to produce water and heat.

An electrolysis cell represents a fuel cell operated in reverse. A basic electrolysis cell functions as a hydrogen generator by decomposing water into hydrogen and oxygen gases when an external electric potential is applied. The basic technology of a hydrogen fuel cell or an electrolysis cell can be applied to electrochemical hydrogen manipulation, such as, electrochemical hydrogen compression, purification, or expansion. Electrochemical hydrogen manipulation has emerged as a viable alternative to the mechanical systems traditionally used for hydrogen management. Successful commercialization of hydrogen as an energy carrier and the long-term sustainability of a "hydrogen economy" largely depend on the efficiency and cost-effectiveness of fuel cells, electrolysis cells, and other hydrogen manipulation/management systems.

In operation, a single fuel cell can generally generate about 1 volt. To obtain the desired amount of electrical power, individual fuel cells are combined to form a fuel cell stack. The fuel cells are stacked together sequentially, each cell including a cathode, an electrolyte membrane, and an anode. Each cathode/membrane/anode assembly constitutes a "membrane electrode assembly", or "MEA", which is typically supported on both sides by bipolar plates. Gases (hydrogen and air) are supplied to the electrodes of the MEA through channels or grooves formed in the plates, which are known as flow fields. In addition to providing mechanical support, the bipolar plates (also known as flow field plates or separator plates) physically separate individual cells in a stack while electrically connecting them in series.

Additionally, a typical fuel cell stack includes manifolds and inlet ports for directing the fuel and oxidant to the anode and cathode flow fields, respectively. The stack may also include a manifold and inlet port for directing a coolant fluid to interior channels within the stack to absorb heat generated during operation of the individual cells. A fuel cell stack also includes exhaust manifolds and outlet ports for expelling the unreacted gases and the coolant water.

FIG. 1 is an exploded schematic view showing the various components of a PEM fuel cell 10. As illustrated, bipolar plates 2 flank the "membrane electrode assembly" (MEA), which comprises an anode 7A, a cathode 7C, and an electrolyte membrane 8. Hydrogen atoms supplied to anode 7A are electrochemically split into electrons and protons (hydrogen ions). The electrons flow through an electric circuit to cathode 7C and generate electricity in the process, while the protons move through electrolyte membrane 8 to cathode 7C. At the cathode, protons combine with electrons and oxygen (supplied to the cathode) to produce water and heat.

Additionally, PEM fuel cell 10 comprises electrically-conductive gas diffusion layers (GDLs) 5 within the cell on each side of the MEA. GDLs 5 serve as diffusion media enabling the transport of gases and liquids within the cell, provide part of the electrical conduction path between bipolar plates 2 and electrolyte membrane 8 through the flow fields 4, 6. GDLs 5 can also aid in the removal of heat and process water from the cell, and in some cases, provide mechanical support to electrolyte membrane 8. GDLs 5 can comprise a woven or non-woven carbon or other conductive material cloth with electrodes 7A and 7C located on the sides facing the electrolyte membrane. In some cases, the electrodes 7A and 7C include an electrocatalyst material coated onto either the adjacent GDL 5 or the electrolyte membrane 8. Some high pressure or high differential pressure fuel cells use "frit"-type densely sintered metals, screen packs, expanded metals, metal foam, or three-dimensional porous metallic substrates in combination with or as a replacement for traditional GDLs to provide structural support to the MEA in combination with traditional, land-channel flow fields 4, 6 formed in the bipolar plates 2. In a typical fuel cell, reactant gases on each side of the electrolyte membrane flow through the flow fields and then diffuse through the porous GDL to reach the electrolyte membrane.

The performance of an electrochemical cell or a cell stack can decay over time for a number of reasons, including, but not limited to, flooding of the cells with water, contamination of the reactant gases, fuel crossover, back diffusion, poisoning of the membranes or catalysts, etc. Fuel crossover in particular, i.e., leakage of fuel from the anode side to the cathode side, is a cause for serious concern regarding the safety and efficiency of an electrochemical cell. Fuel crossover can occur around or through the electrolyte membrane of the MEA, and is generally caused by either leaky seals between the cell components, puncture or tearing of the membrane, or naturally occurring seepage through the membrane. Fuel leakage across the membrane is highly undesirable because it can cause direct combustion reaction between oxygen (supplied to the cathode) and the fuel and damage the cell/stack. Further, crossover results in fuel wastage; the fuel can possibly leak into the coolant supply and cause further contamination; or the fuel can cause external leaks and contaminate the entire cell stack environment.

Fuel crossover, back diffusion, flooding, contamination, and various other factors that influence the performance of a cell stack, cause a drop in voltage across the cell/stack and loss of efficiency. For instance, in an electrochemical hydrogen compression (EHC) cell stack, the hydrogen output is directly proportional to the current through the stack; increase in the required voltage to deliver a given current is a direct indication of cell/stack degradation. Therefore, when any of these damaging conditions arise, corrective action is necessary to prevent irreversible cell/stack degradation and catastrophic in-the-field failures.

The present disclosure is directed towards a method and a system for monitoring the performance of a cell or a stack of cells to preemptively identify damaging conditions resulting in performance decay so as to enable repair/service of the cell/stack prior to failure. The monitoring can be performed remotely by measuring the voltage across the cell/stack (referred to hereinafter as the "stack voltage") and comparing the measured values to predetermined reference values to determine the condition of a cell/stack.

A first aspect of the present disclosure is an electrochemical cell system comprising an electrochemical cell, a voltage measurement device adapted to measure a voltage across the cell, and a control unit configured to process voltage signals received from the voltage measurement device, wherein the control unit is configured to conduct a linear current sweep across the cell.

Another aspect of the present disclosure is a method for monitoring an electrochemical cell. The method comprises the steps of conducting a linear current sweep across the cell, generating a baseline voltage-current (V-I) curve of the cell and calculating a slope of the baseline V-I curve, generating an aged V-I curve of the cell at any time point during operation of the cell and calculating a slope of the aged V-I curve, calculating a difference in value between the slopes of the baseline V-I curve and the aged V-I curve, and comparing the difference in value between the slopes of the baseline V-I curve and the aged V-I curve to a preset reference value.

Yet another aspect of the present disclosure is a method for monitoring an electrochemical cell. The method comprises the steps of measuring a voltage required to deliver a given current through the cell at the beginning of the cell's life to establish a baseline voltage, measuring a voltage required to deliver a given current through the cell at any time point during operation of the cell to establish an aged voltage, calculating a difference between the baseline voltage and the aged voltage, and comparing the difference in value between the baseline voltage and the aged voltage to a preset reference value The accompanying drawings, which are incorporated in and constitute a part of this specification, illustrate embodiments of the invention and together with the description, serve to explain the principles of the various aspects of the invention.

Figure 1:
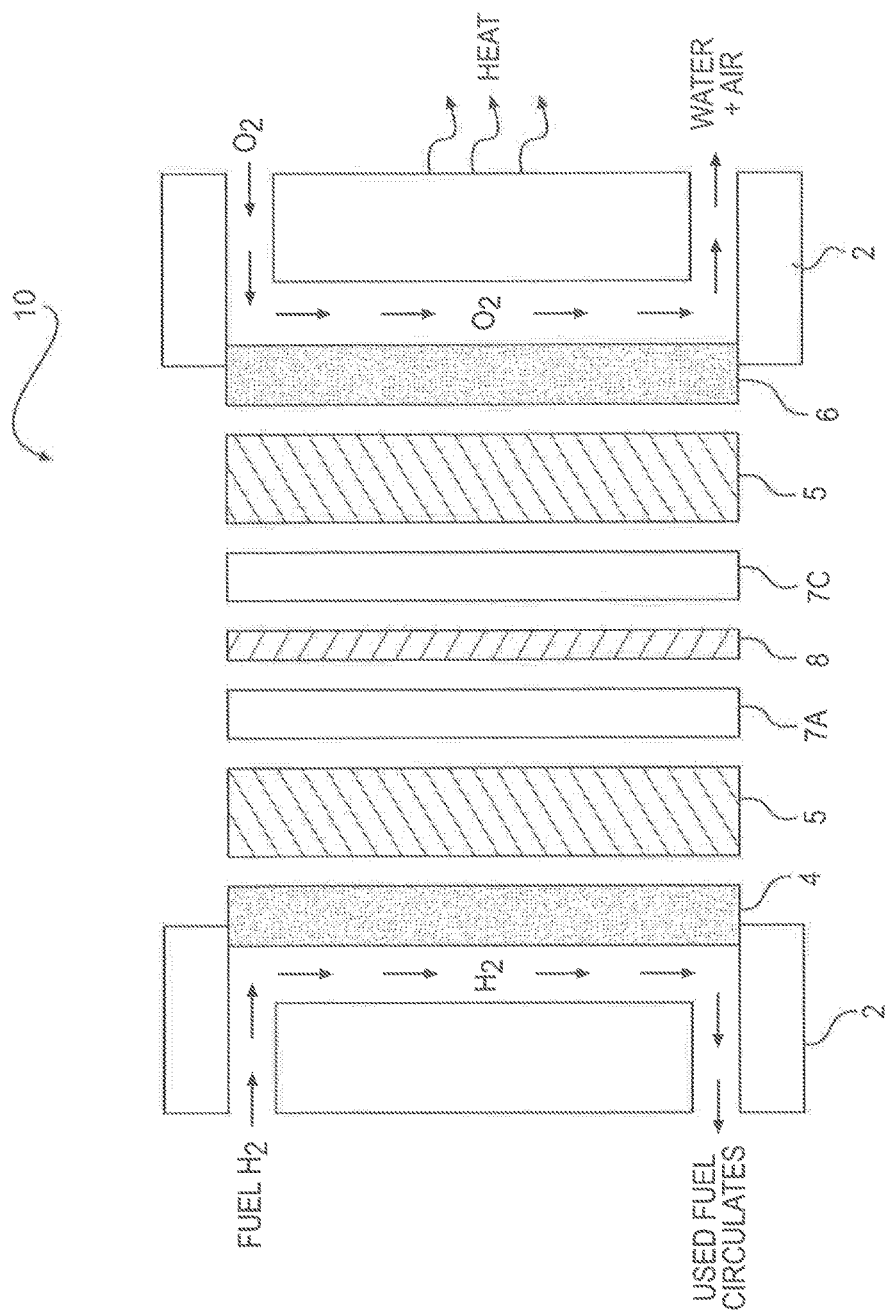
FIG. 1 illustrates an exploded schematic view showing the various components of a Proton Exchange Membrane (PEM) fuel cell.
Figure 2A:
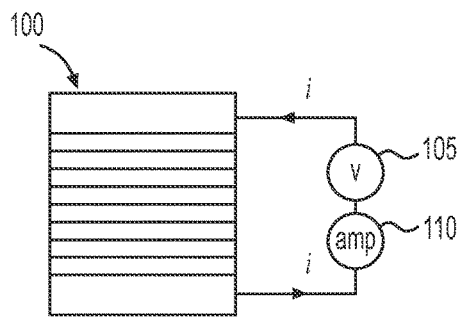
FIG. 2A illustrates a schematic view showing voltage measurement across an exemplary cell stack.
Figure 2B:
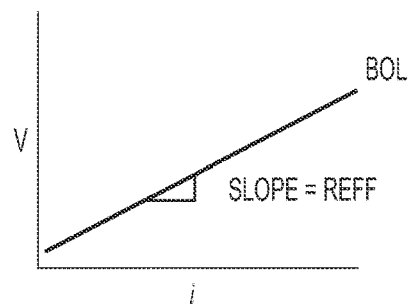
Figure 2C:
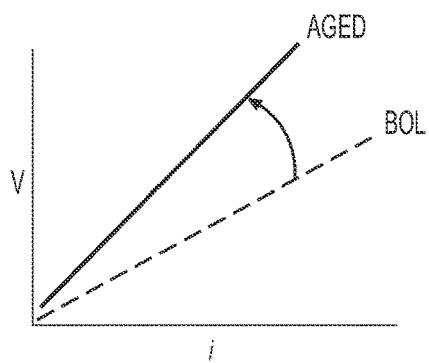

FIG. 2B illustrates a V-I curve generated using a linear current sweep conducted at the beginning of life (BOL) of an electrochemical cell stack, in accordance with exemplary embodiments of the present disclosure; and FIG. 2C illustrates a V-I curve generated using a linear current sweep conducted after field operation of the electrochemical cell stack identified in FIG. 2B, in accordance with exemplary embodiments of the present disclosure.

It is to be understood that both the foregoing general description and the following detailed description are exemplary and explanatory only and are not restrictive of the invention, as claimed.

Reference will now be made to certain embodiments consistent with the present disclosure, examples of which are illustrated in the accompanying drawings. Wherever possible, the same reference numbers are used throughout the drawings to refer to the same or like parts. It is to be understood that the systems and methods of the present disclosure can be employed with various types of electrochemical cells, including, but not limited to, high pressure and low pressure cells, high differential pressure cells (e.g., electrochemical hydrogen compressor), cells with a low rate of heat generation, as well as cells operating at a high rate of heat generation. Also, it is to be understood that although the present disclosure is described in relation to an electrochemical cell stack, the systems and methods of the present disclosure can be employed with individual electrochemical cells as well.

Electrochemical cell stacks comprise a plurality of individual cells. In an exemplary cell stack 100, shown in FIG. 2A, each cell comprises a "membrane electrode assembly" (MEA), which includes an anode, a cathode, and an electrolyte membrane. In exemplary embodiments, the cell comprises a GDL and bipolar plate on each side of the MEA to direct the reactant gases through the cell. In some embodiments, each electrochemical cell in a cell stack comprises two bipolar plates, one on each side of the membrane-electrode-assembly (MEA) i.e., if the stack comprises n cells, then the total number of bipolar plates in the stack is 2n. In some other embodiments, two adjacent electrochemical cells in a stack share a bipolar plate, i.e., if the stack comprises n cells, then the total number of bipolar plates in the stack is (n+1). In such embodiments, a single bipolar plate can have flow field features on both sides of the plate—for instance, one side of the plate supports the GDL of one cell and the other side supports the GDL of an adjoining cell.

In exemplary embodiments, the cell stack further comprises pressure transmitters arranged in the reactant fluid inlet and outlet. The pressure transmitters can be configured to measure the pressure of the reactant fluid at the inlet ("$P_{in}$") and the pressure at the outlet ("$P_{out}$"), and to report the measured pressure values to a control system associated with the electrochemical cell stack. The cell stack can further include one or more voltage monitoring devices 105, e.g., voltmeters, to measure the total voltage across the stack. In select embodiments, the cell stack may comprise additional voltage measuring devices to measure the voltage across individual cells. Further, in some embodiments, the cell stack may comprise one or more ammeters 110 to measure the current through the cells.

In exemplary embodiments, the voltage across the cell stack ("$V_{stack}$") and current through the cell "$I_{stack}$" are measured in real-time, as shown in FIG. 2A. The measured signal is transmitted to the control system, which may be a remote unit. In select embodiments, the signal can be transmitted wirelessly to the remote control system associated with the stack. The control system is configured to generate a linear current sweep at the beginning of life ("BOL") of the cell stack to establish a baseline V-I characteristic of the stack, as indicated in FIG. 2B. The baseline V-I curve is established using a predetermined ratio of $P_{in}$ and $P_{out}$. The control system calculates slope of the V-I curve, which provides the effective resistance ("$R_{eff}$") of the stack. "$R_{eff}$" is the average resistivity of the cells in the stack, measured in ohms-cm$^2$. "$R_{eff}$" may be calculated by subtracting the Nernst voltage of a cell from the actual voltage across the cell. In select embodiments, $R_{eff}$ is measured according to equation (1) below:

$$R_{eff} = \frac{\frac{V_{stack}}{N_{cell}} - \frac{RT}{2F}\ln\left(\frac{P_{out}}{P_{in}}\right)}{\frac{I_{stack}}{AA_{cell}}} \quad (1)$$

wherein "$N_{cell}$" is the number of cells in the stack; "T" is the operating temperature of the stack; "AA" is the active area of the cell (ranging from about 10 cm² to about 2000 cm²; typically about 250 cm²); "F" is Faraday's constant (96485.3 Coulombs/mol); "T" is the average absolute temperature of the stack (provided in kelvin (K) unit of measurement); "R" is the universal gas constant (8.31451 J/mol K).

The current sweep can be repeated periodically, and the slope ("$R_{eff}$") of the stack can be calculated for each repetition of the current sweep. The value of the slope at a particular time point can be compared to the value of the slope at BOL, and the difference between the two values ("ΔSlope") can be recorded. As the stack ages, the slope of the V-I curve can increase, which is a direct indication of performance degradation of the stack due to various reasons, such as, fuel crossover, impurities in the incoming fuel, etc. Increase in the slope of the V-I curve in effect increases the ΔSlope value.

In select embodiments, the control system is configured to measure the voltage at a given current value, instead of measuring the V-I slope. Rise in voltage across the stack ("ΔV") indicates that the amount of voltage required to deliver a given current increases, which in turn points to performance degradation of the stack. The ΔSlope (or ΔV) value for each measurement can then be compared against a predetermined reference value. If the ΔSlope (or ΔV) is greater than the reference value, then corrective measures can be taken, for example, an alarm can be triggered to alert the operator of the stack of potential undesirable conditions. In some embodiments, the control system can be configured to automatically initiate preventative actions, for example, triggering shutdown of the stack, initiating a purge cycle to automatically clean the incoming fuel line, etc. In select embodiments, the reference value can be varied over time to accommodate changes in ΔSlope (or ΔV) values due to normal cell degradation over time.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An electrochemical cell system, comprising:
an electrochemical cell;
a voltage measurement device adapted to measure a voltage across the electrochemical cell;
pressure transmitters connected to an inlet gas channel and an outlet gas channel, wherein the pressure transmitters are configured to measure the pressure at the inlet ($P_{in}$) and at the outlet ($P_{out}$); and
a control unit configured to process voltage signals received from the voltage measurement device, wherein the control unit is configured to:
conduct a linear current sweep across the electrochemical cell;
generate a voltage-current (V-I) curve based on the linear current sweep;
generate a baseline V-I curve of the electrochemical cell using a predetermined ratio of pressures of $P_{in}$ and $P_{out}$ and to calculate a slope of the baseline V-I curve;
generate an aged V-I curve of the electrochemical cell at any time point during operation of the electrochemical cell and to calculate a slope of the aged V-I curve;
to calculate a difference in value between the slopes of the baseline V-I curve and the aged V-I curve;
compare the difference in value between the slopes of the baseline V-I curve and the aged V-I curve to a preset reference value; and
automatically initiate at least one corrective action if the difference in value between the slopes of the baseline V-I curve and the aged V-I curve is greater than the preset reference value,
wherein the corrective action is chosen from alerting an operator and initiating a preventative action.

2. The electrochemical cell system of claim 1, wherein the control unit is configured to measure a voltage required to deliver a given current through the electrochemical cell at the beginning of the electrochemical cell's life to establish a baseline voltage value.

3. The electrochemical cell system of claim 2, wherein the control unit is configured to measure a voltage required to deliver a given current through the electrochemical cell at any time point during operation of the electrochemical cell to establish an aged voltage value.

4. The electrochemical cell system of claim 3, wherein the control unit is configured to calculate the difference between the baseline voltage value and the aged voltage value and to alert an operator of the electrochemical cell if the difference in value is greater than a preset reference value.

5. The electrochemical cell system of claim 1, wherein the electrochemical cell is an electrochemical hydrogen compressor.

6. The electrochemical cell system of claim 1, wherein the corrective action automatically initiated by the control unit is chosen from triggering a shutdown of the electrochemical cell and initiating a purge cycle to automatically clean an incoming fuel line of the electrochemical cell system.

7. The electrochemical cell system of claim 1, wherein the reference value is varied over time to accommodate changes to the difference in slope values due to normal cell degradation over time.

* * * * *